(12) United States Patent
Nguyen et al.

(10) Patent No.: US 8,932,495 B1
(45) Date of Patent: Jan. 13, 2015

(54) TRANSPARENT CONDUCTOR MATERIALS AND PROCESSES FOR FORMING SUCH MATERIALS

(75) Inventors: Paul Phong Nguyen, San Jose, CA (US); Scott Allen Jewhurst, Redwood City, CA (US)

(73) Assignee: Clearist, Inc., San Jose, CA (US)

( * ) Notice: Subject to any disclaimer, the term of this patent is extended or adjusted under 35 U.S.C. 154(b) by 33 days.

(21) Appl. No.: 13/418,129

(22) Filed: Mar. 12, 2012

Related U.S. Application Data (60) Provisional application No. 61/451,224, filed on Mar. 10, 2011.

(51) Int. Cl.
   *H01B 1/08* (2006.01)

(52) U.S. Cl.
   USPC ............. 252/519.1; 252/519.12; 252/519.5; 252/519.51; 252/520.1; 252/520.21; 252/520.5; 136/260; 136/262; 136/265; 136/252

(58) Field of Classification Search
   CPC .......... H01B 1/023; H01B 1/08; H01B 31/04; H01B 31/0288; H01B 31/0264; H01B 31/0296; H01B 31/0304; H01B 31/0312; H01B 31/032; H01B 31/0328
   USPC ............. 252/519.1, 519.12, 519.5, 519.51, 252/520.1, 520.21, 520.5; 136/260, 262, 136/265, 252
   See application file for complete search history.

(56) References Cited

U.S. PATENT DOCUMENTS

| | | | |
|---|---|---|---|
| 5,558,723 A * | 9/1996 | Ufert | 136/244 |
| 6,551,715 B1 * | 4/2003 | Seto et al. | 428/432 |
| 7,364,808 B2 * | 4/2008 | Sato et al. | 428/702 |
| 2005/0000564 A1 * | 1/2005 | Sato et al. | 136/256 |
| 2010/0095866 A1 * | 4/2010 | Schreiber et al. | 106/286.6 |
| 2012/0049128 A1 * | 3/2012 | Graw et al. | 252/512 |

* cited by examiner

*Primary Examiner* — Douglas Mc Ginty
(74) *Attorney, Agent, or Firm* — Caesar, Rivise, Bernstein, Cohen & Pokotilow, Ltd.

(57) ABSTRACT

Embodiments of the invention generally provide hydrogen-doped and/or fluorine-doped transparent conducting oxide (TCO) materials and processes for forming such doped TCO materials. In one embodiment, a method for fabricating a doped TCO on a substrate surface includes forming a TCO material on a substrate, exposing the TCO material to a hydrogen plasma while forming a hydrogen-doped TCO material during an atmospheric pressure plasma (APP) process, wherein the hydrogen-doped TCO material contains atomic hydrogen at a concentration within a range from about 1 at % (atomic percent) to about 30 at %, and exposing the hydrogen-doped TCO material to a thermal annealing process. In another embodiment, the method includes exposing the TCO material to a fluorine plasma while forming a fluorine-doped TCO material during the APP process, wherein the fluorine-doped TCO material contains atomic fluorine at a concentration within a range from about 1 at % to about 30 at %.

22 Claims, 1 Drawing Sheet

TRANSPARENT CONDUCTOR MATERIALS AND PROCESSES FOR FORMING SUCH MATERIALS

CROSS-REFERENCE TO RELATED APPLICATION

This application claims benefit of U.S. Ser. No. 61/451,224, filed Mar. 10, 2011, which is herein incorporated by reference in its entirety.

BACKGROUND OF THE INVENTION

1. Field of the Invention

Embodiments of the invention generally relate to conductive and semi-conductive materials and processes for forming such materials, and more particular to doped transparent conducting oxide (TCO) materials and deposition processes for forming such doped TCO materials.

2. Description of the Related Art

Multicomponent TCO complex oxides with multications have been recently developed to meet the electronic, optical, and chemical requirements for applications in the display, solar cell, and lighting industries. Carrier generation in multicomponent TCOs via metal dopants and oxygen deficiency currently are difficult to implement and controlled, however, because of the complex nature of the oxide.

From the early 1990s, multicomponent TCOs, also called multinary TCOs, have been explored and developed to meet specific electronic, optical, and chemical requirements for applications in the display, solar cell, and lighting industries. Multicomponent TCOs are complex oxides containing two or more types of cations whose concentrations often far exceed the doping levels for conventional TCOs. Depending on the materials and compositions, some multicomponent TCOs are crystalline or polycrystalline while others are amorphous. A few multicomponent TCOs also have a layered structure. To date, the majority of multicomponent TCOs are derived from the oxides such as $In_2O_3$, $SnO_2$, ZnO, CdO, and $Ga_2O_3$.

Although many n-type multicomponent TCOs have surprisingly high carrier mobility, carrier generation has been challenging because targeted doping via aliovalent substitution is hampered by the possibility of same-valence substitution or anti-site defects which can neutralize the donors. Clustering and second phase formation can further reduce the effectiveness of the dopant. Oxygen vacancies, therefore, become a primary means to generate carriers for multicomponent TCOs. However, oxygen-deficient multicomponent TCOs can be difficult to produce in a controlled manner and can be environmentally unstable.

Existing methods for enhancing TCO materials or thin films and improving the material performance currently require expensive and energy intensive vacuum processing equipment (e.g., sputtering, low pressure plasma, PE-MOCVD), slow batch processing methods (vacuum methods, annealing in hydrogen gas mixtures) or are poorly reproducible and hazardous (in-line annealing in overpressure of gas mixtures). Several TCOs have been chemically doped during the initial growth of the TCO thin film. The decomposition of the toxic, corrosive, or explosive chemical precursor dopant source typically provides a poor level of activation of the dopant and TCO and also forms a dangerous working environment. All of the aforementioned methods increases the cost of manufacturing and reduces throughput.

Therefore, there is a need for doped TCO materials with improved conductivity and mobility of carriers, improved transparency in the visible and near-infrared (NIR) spectra, and processes for forming such TCO materials at a reduced cost of manufacturing and increased throughput.

SUMMARY OF THE INVENTION

Embodiments of the invention generally provide hydrogen-doped and/or fluorine-doped transparent conducting oxide (TCO) materials and processes for forming such doped TCO materials. In one embodiment, a method for fabricating a doped TCO on a substrate surface includes forming a TCO material on a substrate, exposing the TCO material to a hydrogen plasma while forming a hydrogen-doped TCO material during an atmospheric pressure plasma (APP) process, wherein the hydrogen-doped TCO material contains atomic hydrogen at a concentration within a range from about 1 at % (atomic percent) to about 30 at %, and exposing the hydrogen-doped TCO material to a thermal annealing process. In another embodiment, the method includes exposing the TCO material to a fluorine plasma while forming a fluorine-doped TCO material during the APP process, wherein the fluorine-doped TCO material contains atomic fluorine at a concentration within a range from about 1 at % to about 30 at %.

Traditional TCOs need better performance, especially higher electron mobility, and lower production cost. Embodiments of the invention described herein provide TCO materials and processes that outperform the traditional TCOs and the existing processes for forming traditional TCOs. In one embodiment, a composition is provided and includes multicomponent TCO materials that are doped with fluorine and/or hydrogen and have improved electronic, optical and environmental stability properties. In another embodiment, a method is provided and includes applying APP containing hydrogen and/or fluorine to improve electronic, optical and environmental stability properties of TCO materials or thin films.

Embodiments described herein provide the incorporation of atomic hydrogen into various TCO materials by APP processes and other techniques to markedly improve the TCO conductivity and mobility of carriers, while also improving the transparency in the visible and NIR spectra due to low free carrier absorption (FCA). Hydrogen complexes with oxygen vacancies, forming a shallow donor state, as well as bonding to oxygen (creating H—O—) along the M—O bond center, typically in an antibonding site, which also results in the creation of highly mobile shallow donor states. Atomic hydrogen incorporation also neutralizes charged scattering centers such as self-interstitials in the host material and vacancies on either the M or O site, leading to an improvement in carrier mobility. Additionally, less environmentally stable TCOs, such as materials of the zinc oxide family, observe a significant improvement in resistance to degradation by moisture or oxygen on the free surfaces due to the passivation of the dangling bonds on the free surfaces by chemisorption of hydrogen. Chemisorption of hydrogen or otherwise hydrogen incorporation has provided the added benefit of altering the work function of the TCO materials, allowing for optimization for a specific application (organic LED displays or thin film photovoltaics), and also neutralizing the charged scattering centers and carrier traps (vacancies, dangling bonds, charged interstitials). Hydrogen incorporation, in examples herein, is utilized to manipulate the crystallinity and texture of TCO materials or thin films, and also to promote the formation of amorphous TCO materials or thin films.

In some embodiments described herein, a method for fabricating a TCO containing hydrogen on a substrate surface is provided and includes forming a TCO material on a substrate, exposing the TCO material to a hydrogen plasma while forming a hydrogen-doped TCO material during an APP process, wherein the hydrogen-doped TCO material contains atomic hydrogen at a concentration within a range from about 1 at % to about 30 at %, and exposing the hydrogen-doped TCO material to a thermal annealing process. Generally, during the APP process, the TCO material is exposed to the hydrogen plasma at a pressure within a range from about 0.90 atm to about 1.10 atm and more narrowly within a range from about 0.95 atm to about 1.05 atm, such as about 1 atm or at ambient pressure.

In some examples, the method further provides that the hydrogen-doped TCO material contains hydrogen, oxygen, and at least two elements, such as cadmium, tin, indium, zinc, gallium, magnesium, titanium, aluminum, calcium, antimony, tungsten, molybdenum, niobium, tantalum, zirconium, or combinations thereof. Generally, the hydrogen-doped TCO material contains at least two metallic elements. In some examples, the hydrogen-doped TCO material contains one or more binary oxide materials selected from cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, or combinations thereof. In other examples, the hydrogen-doped TCO material contains one or more ternary oxide materials selected from zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, or combinations thereof.

The method may also provide that the hydrogen-doped TCO material generally contains atomic hydrogen at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %. Generally, the hydrogen-doped TCO material contains interstitial atomic hydrogen, such as hydrogen atoms disposed within the interstitial positions of the crystalline lattice. Additionally, the hydrogen-doped TCO material contains hydrogen atoms that occupy atomic positions of the crystalline lattice.

In some embodiments of the method, the hydrogen plasma may be formed from a process gas containing hydrogen gas and at least one or more gases, such as argon, helium, neon, xenon, nitrogen, forming gas, or mixtures thereof. The process gas generally contains hydrogen gas at a concentration within a range from about 0.001 at % to about 30 at %, more narrowly within a range from about 0.1 at % to about 10 at %, and more narrowly within a range from about 1 at % to about 5 at %. In some examples, a thermal APP process is utilized to form the hydrogen-doped TCO materials. In other examples, a non-thermal APP process is utilized to form the hydrogen-doped TCO materials.

In further embodiments described herein, a composition of a hydrogen-doped TCO material is provided and contains hydrogen and an oxide of at least two elements selected from cadmium, tin, indium, zinc, gallium, magnesium, titanium, aluminum, calcium, antimony, tungsten, molybdenum, niobium, tantalum, zirconium, or combinations thereof and has atomic hydrogen at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %.

In other embodiments described herein, a method for fabricating a TCO containing fluorine on a substrate surface is provided and includes forming a TCO material on a substrate, exposing the TCO material to a fluorine plasma while forming a fluorine-doped TCO material during an APP process, wherein the fluorine-doped TCO material contains atomic fluorine at a concentration within a range from about 1 at % to about 30 at %, and exposing the fluorine-doped TCO material to a thermal annealing process. Generally, during the APP process, the TCO material is exposed to the fluorine plasma at a pressure within a range from about 0.90 atm to about 1.10 atm and more narrowly within a range from about 0.95 atm to about 1.05 atm, such as about 1 atm or at ambient pressure.

In some examples, the method further provides that the fluorine-doped TCO material contains fluorine, oxygen, and at least two elements, such as cadmium, tin, indium, zinc, gallium, magnesium, titanium, aluminum, calcium, antimony, tungsten, molybdenum, niobium, tantalum, zirconium, or combinations thereof. Generally, the fluorine-doped TCO material contains at least two metallic elements. In some examples, the fluorine-doped TCO material contains one or more binary oxide materials selected from cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, or combinations thereof. In other examples, the fluorine-doped TCO material contains one or more ternary oxide materials selected from zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, or combinations thereof.

The method also provides that the fluorine-doped TCO material contains atomic fluorine at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %. Generally, the fluorine-doped TCO material contains interstitial atomic fluorine, such as fluorine atoms disposed within the interstitial positions of the crystalline lattice. Additionally, the fluorine-doped TCO material contains fluorine atoms that occupy atomic positions of the crystalline lattice.

In some embodiments of the method, the fluorine plasma may be formed from a process gas containing fluorine gas and at least one or more gases, such as argon, helium, neon, xenon, nitrogen, forming gas, or mixtures thereof. The process gas generally contains fluorine gas at a concentration within a range from about 0.001 at % to about 30 at %, more narrowly within a range from about 0.1 at % to about 10 at %, and more narrowly within a range from about 1 at % to about 5 at %. In some examples, a thermal APP process is utilized to form the fluorine-doped TCO materials. In other examples, a non-thermal APP process is utilized to form the fluorine-doped TCO materials.

In further embodiments described herein, a composition of a fluorine-doped TCO material is provided and contains fluorine and an oxide of at least two elements selected from cadmium, tin, indium, zinc, gallium, magnesium, titanium, aluminum, calcium, antimony, tungsten, molybdenum, niobium, tantalum, zirconium, or combinations thereof and has atomic fluorine at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %.

In other embodiments described herein, a method for fabricating a TCO containing hydrogen and fluorine on a substrate surface is provided and includes forming a TCO material on a substrate, exposing the TCO material to a hydrogen plasma, a fluorine plasma, or mixtures thereof while forming a hydrogen and fluorine-doped TCO material during at least one APP process, and exposing the fluorine-doped TCO material to a thermal annealing process. The hydrogen and fluorine-doped TCO material contains atomic hydrogen at a concentration within a range from about 1 at % to about 30 at % and atomic fluorine at a concentration within a range from about 1 at % to about 30 at %.

In some examples, the method provides that the TCO material is exposed to the hydrogen plasma during a first APP process and subsequently exposed to the fluorine plasma during a second APP process. In the other examples, the method provides that the TCO material is exposed to the fluorine plasma during a first APP process and subsequently exposed to the hydrogen plasma during a second APP process. Alternatively, in other examples, the method provides that the TCO material is exposed to the hydrogen plasma and the fluorine plasma during a single APP process.

In some examples, the method further provides that the hydrogen and fluorine-doped TCO material contains hydrogen, fluorine, oxygen, and at least two elements, such as cadmium, tin, indium, zinc, gallium, magnesium, titanium, aluminum, calcium, antimony, tungsten, molybdenum, niobium, tantalum, zirconium, or combinations thereof. Generally, the hydrogen and fluorine-doped TCO material contains at least two metallic elements. In some examples, the hydrogen and fluorine-doped TCO material contains one or more binary oxide materials selected from cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, or combinations thereof. In other examples, the hydrogen and fluorine-doped TCO material contains one or more ternary oxide materials selected from zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, or combinations thereof.

The method further provides that the hydrogen and fluorine-doped TCO material contains atomic hydrogen at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %, and contains atomic fluorine at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %. Generally, the hydrogen-doped TCO material contains interstitial atomic hydrogen, such as hydrogen atoms disposed within the interstitial positions of the crystalline lattice. Additionally, the hydrogen-doped TCO material contains hydrogen atoms that occupy atomic positions of the crystalline lattice.

The hydrogen plasma may be formed from a process gas containing hydrogen gas at a concentration within a range from about 0.001 at % to about 30 at %, more narrowly within a range from about 0.1 at % to about 10 at %, and more narrowly within a range from about 1 at % to about 5 at %. The fluorine plasma may be formed from a process gas containing fluorine gas at a concentration within a range from about 0.001 at % to about 30 at %, more narrowly within a range from about 0.1 at % to about 10 at %, and more narrowly within a range from about 1 at % to about 5 at %. In some examples, a thermal APP process is utilized to form the hydrogen and fluorine-doped TCO materials. In other examples, a non-thermal APP process is utilized to form the hydrogen and fluorine-doped TCO materials.

In further embodiments described herein, a composition of a hydrogen and fluorine-doped TCO material is provided and contains hydrogen, fluorine, and an oxide of at least two elements selected from cadmium, tin, indium, zinc, gallium, magnesium, titanium, aluminum, calcium, antimony, tungsten, molybdenum, niobium, tantalum, zirconium, or combinations thereof. In many examples, the hydrogen and fluorine-doped TCO material contains atomic hydrogen at a concentration within a range from about 1 at % to about 20 at % and contains atomic fluorine at a concentration within a range from about 1 at % to about 20 at %. In some examples, the hydrogen and fluorine-doped TCO material has a concentration of the atomic hydrogen within a range from about 5 at % to about 15 at % and a concentration of the atomic fluorine is within a range from about 5 at % to about 15 at %, more narrowly a concentration of the atomic hydrogen within a range from about 8 at % to about 12 at % and a concentration of the atomic fluorine is within a range from about 8 at % to about 12 at %.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally provide hydrogen-doped and/or fluorine-doped transparent conducting oxide (TCO) materials and processes for forming such doped TCO materials. In one embodiment, a composition is provided and includes hydrogen-doped TCO materials, fluorine-doped TCO materials, and hydrogen and fluorine-doped TCO materials. These aforementioned doped TCO materials have carrier generation with good control and are robust with strong chemical stability. Since fluorine and oxygen atoms are similar in size, substitutional doping of oxygen by fluorine should produce minimum distortion to the lattice, keeping the mobility high, while providing electron carriers to the conduction band. Besides substituting oxygen, fluorine dopants can also reduce the number of scattering sites (F-interstitials) and reducing the free carrier absorption (FCA), improving the mobility and transparency of the multicomponent TCO. Fluorine is also beneficial to improving the stability of TCO materials based on ZnO against degradation by oxygen or water through passivation of the grain boundaries and free surfaces.

In some embodiments, a fluorine-doped TCO material contains fluorine, oxygen, and at least two elements, such as cadmium, tin, indium, zinc, gallium, magnesium, titanium, aluminum, calcium, antimony, tungsten, molybdenum, niobium, tantalum, zirconium, or combinations thereof. Generally, the fluorine-doped TCO material contains at least two metallic elements. In some examples, the fluorine-doped TCO material contains one or more binary oxide materials selected from cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, or combinations thereof. Examples of fluorine-doped multicomponent TCO binary compounds and binary solid solutions include $Cd_2SnO_4$:F, $CdIn_2O_4$:F, $CdSnO_3$:F, $ZnSnO_3$:F, $Zn_2SnO_4$:F, $ZnGa_2O_4$:F, $In_4Sn_3O_{12}$:F, $Zn_kIn_2O_{k+3}$:F (k=2, 3, 7, 9, 11, 13, 15), $Ti_{(1-x)}M_xO_2$:F (M=Nb or Ta, and 0<x<1), $MgIn_2O_4$:F, $12CaO.7Al_2O_3$:F, $Ga_{2-2x}In_{2x}O_3$:F, wherein 0<x<1, alloys thereof, derivatives thereof, doped variants thereof, or combinations thereof.

In other examples, the fluorine-doped TCO material contains one or more ternary oxide materials selected from zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, or combinations thereof. Examples of fluorine-doped multicomponent TCO ternary compounds and ternary solid solutions include $Zn_{2-x}In_{2x}Sn_{1-x}O_4$:F (x=0-1) (ZITO:F), $Ga_{3-x}In_{5+x}Sn_2O_{16}$:F (x=0-1), $In_{1-x}Ga_{1+x}O_3(ZnO)_k$:F (x=0-1, and k=1, 2, 3), $In_{2-2x}Sn_xZn_xO_3$:F (x=0-1), $nCd_2SnO_4.(1-n)CdIn_2O_4$:F, wherein 0<n<1, $In_{2-2x}Cd_xSn_xO_3$:F (x=0-1), $Cd_{1-x}Sn_{1-x}In_{2x}O_3$:F (x=0-1), $nZn_2SnO_4.(1-n)ZnGa_2O_4$:F, wherein 0<n<1, $In_{4+x}Sn_{3-2x}Sb_xO_{12}$:F (x=0-1.5), alloys thereof, derivatives thereof, doped variants thereof, or combinations thereof.

The fluorine-doped TCO material generally contains atomic fluorine at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %. Generally, the fluorine-doped TCO material contains interstitial atomic fluorine, such as fluorine atoms disposed within the interstitial positions of the crystalline lattice. Additionally, the fluorine-doped TCO material contains fluorine atoms that occupy atomic positions of the crystalline lattice.

In further embodiments described herein, an exemplary composition of a fluorine-doped TCO material is provided and contains fluorine and an oxide of at least two elements selected from cadmium, tin, indium, zinc, gallium, magnesium, titanium, aluminum, calcium, antimony, tungsten, molybdenum, niobium, tantalum, zirconium, or combinations thereof and has atomic fluorine at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %.

The hydrogen-doped TCO materials formed by processes described herein have improved performance and properties over the TCO materials formed by traditional processes. The hydrogen-doped TCO materials have reduced electrical resistivity, increased carrier density and mobility, increased the transparency in the visible and near-infrared (NIR) wavelengths, reduced surface defects, allowed modulation of the work function, and improved environmental stability over the TCO materials formed by traditional processes.

In some embodiments, a hydrogen-doped TCO material contains hydrogen, oxygen, and at least two elements, such as cadmium, tin, indium, zinc, gallium, magnesium, titanium, aluminum, calcium, antimony, tungsten, molybdenum, niobium, tantalum, zirconium, or combinations thereof. Generally, the hydrogen-doped TCO material contains at least two metallic elements. In some examples, the hydrogen-doped TCO material contains one or more binary oxide materials selected from cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, or combinations thereof. Examples of hydrogen-doped multicomponent TCO binary compounds and binary solid solutions include $Cd_2SnO_4$:H, $CdIn_2O_4$:H, $CdSnO_3$:H, $ZnSnO_3$:H, $Zn_2SnO_4$:H, $ZnGa_2O_4$:H, $In_4Sn_3O_{12}$:H, $Zn_kIn_2O_{k+3}$:H (k=2, 3, 7, 9, 11, 13, 15), $Ti_{(1-x)}M_xO_2$:H (M=Nb or Ta, and 0<x<1), $MgIn_2O_4$:H, $12CaO.7Al_2O_3$:H, $Ga_{2-2x}In_{2x}O_3$:H, wherein 0<x<1, alloys thereof, derivatives thereof, doped variants thereof, or combinations thereof.

In other examples, the hydrogen-doped TCO material contains one or more ternary oxide materials selected from zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, or combinations thereof. Examples of hydrogen-doped multicomponent TCO ternary compounds and ternary solid solutions include $Zn_{2-x}In_{2x}Sn_{1-x}O_4$:H (x=0-1) (ZITO:H), $Ga_{3-x}In_{5+x}Sn_2O_{16}$:H (x=0-1), $In_{1-x}Ga_{1+x}O_3(ZnO)_k$:H (x=0-1, and k=1, 2, 3), $In_{2-2x}Sn_xZn_xO_3$:H (x=0-1), $nCd_2SnO_4.(1-n)CdIn_2O_4$:F, wherein 0<n<1, $In_{2-2x}Cd_xSn_xO_3$:H (x=0-1), $Cd_{1-x}Sn_{1-x}In_{2x}O_3$:H (x=0-1), $nZn_2SnO_4.(1-n)ZnGa_2O_4$:F, wherein 0<n<1, $In_{4+x}Sn_{3-2x}Sb_xO_{12}$:H (x=0-1.5), alloys thereof, derivatives thereof, doped variants thereof, or combinations thereof.

The hydrogen-doped TCO material generally contains atomic hydrogen at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %. Generally, the hydrogen-doped TCO material contains interstitial atomic hydrogen, such as hydrogen atoms disposed within the interstitial positions of the crystalline lattice. Additionally, the hydrogen-doped TCO material contains hydrogen atoms that occupy atomic positions of the crystalline lattice.

In further embodiments described herein, an exemplary composition of a hydrogen-doped TCO material is provided and contains hydrogen and an oxide of at least two elements selected from cadmium, tin, indium, zinc, gallium, magnesium, titanium, aluminum, calcium, antimony, tungsten, molybdenum, niobium, tantalum, zirconium, or combinations thereof and has atomic hydrogen at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %.

In other embodiments, a hydrogen and fluorine-doped TCO material contains hydrogen, fluorine, oxygen, and at least two elements, such as cadmium, tin, indium, zinc, gallium, magnesium, titanium, aluminum, calcium, antimony, tungsten, molybdenum, niobium, tantalum, zirconium, or combinations thereof. Generally, the hydrogen and fluorine-doped TCO material contains at least two metallic elements. In some examples, the hydrogen and fluorine-doped TCO material contains one or more binary oxide materials selected from cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, or combinations thereof. Examples of fluorine-doped and hydrogen-doped multicomponent TCO binary compounds and binary solid solutions include $Cd_2SnO_4$:F:H, $CdIn_2O_4$:F:H, $CdSnO_3$:F:H, $ZnSnO_3$:F:H, $Zn_2SnO_4$:F:H, $ZnGa_2O_4$:F:H, $In_4Sn_3O_{12}$:F:H, $Zn_kIn_2O_{k+3}$:F:H (k=2, 3, 7, 9, 11, 13, 15), $Ti_{(1-x)}M_xO_2$:F:H (M=Nb or Ta, and 0<x<1), $MgIn_2O_4$:F:H, $12CaO.7Al_2O_3$:F:H, $Ga_{2-2x}In_{2x}O_3$:F:H (0<x<1), alloys thereof, derivatives thereof, doped variants thereof, or combinations thereof.

In other examples, the hydrogen and fluorine-doped TCO material contains one or more ternary oxide materials selected from zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, or combinations thereof. Examples of fluorine-doped and hydrogen-doped multicomponent TCO ternary compounds and ternary solid solutions include $Zn_{2-x}In_{2x}Sn_{1-x}O_4$:F:H (x=0-1) (ZITO:F:H), $Ga_{3-x}In_{5+x}Sn_2O_{16}$:F:H (x=0-1), $In_{1-x}Ga_{1+x}O_3(ZnO)_k$:F:H (x=0-1, and k=1, 2, 3), $In_{2-2x}Sn_xZn_xO_3$:F:H (x=0-1), $nCd_2SnO_4.(1-n)CdIn_2O_4$:F, wherein 0<n<1, $In_{2-2x}Cd_xSn_xO_3$:F:H (x=0-1), $Cd_{1-x}Sn_{1-x}In_{2x}O_3$:F:H (x=0-1), $nZn_2SnO_4.(1-n)ZnGa_2O_4$:F, wherein 0<n<1, $In_{4+x}Sn_{3-2x}Sb_xO_{12}$:F:H (x=0-1.5), alloys thereof, derivatives thereof, doped variants thereof, or combinations thereof.

The method further provides that the hydrogen and fluorine-doped TCO material contains atomic hydrogen at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %, and contains atomic fluorine at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %. Generally, the hydrogen and fluorine-doped TCO material contains interstitial atomic hydrogen and atomic fluorine, such as hydrogen and fluorine atoms disposed within the interstitial positions of the crystalline lattice. Additionally, the hydrogen and fluorine-doped TCO material contains hydrogen and fluorine atoms that occupy atomic positions of the crystalline lattice.

In further embodiments described herein, an exemplary composition of a hydrogen and fluorine-doped TCO material is provided and contains hydrogen, fluorine, and an oxide of at least two elements selected from cadmium, tin, indium, zinc, gallium, magnesium, titanium, aluminum, calcium, antimony, tungsten, molybdenum, niobium, tantalum, zirconium, or combinations thereof. In many examples, the hydrogen and fluorine-doped TCO material contains atomic hydrogen at a concentration within a range from about 1 at % to about 20 at % and contains atomic fluorine at a concentration within a range from about 1 at % to about 20 at %. In some examples, the hydrogen and fluorine-doped TCO material has a concentration of the atomic hydrogen within a range from about 5 at % to about 15 at % and a concentration of the atomic fluorine is within a range from about 5 at % to about 15 at %, more narrowly a concentration of the atomic hydrogen within a range from about 8 at % to about 12 at % and a concentration of the atomic fluorine is within a range from about 8 at % to about 12 at %.

In an alternative embodiment, instead of or in addition to hydrogen or fluorine, other metals such as Ti, W, Mo, and/or Zr can also be doped into the TCO materials to increase mobility in solution-based regular or multicomponent TCO materials or thin films. The metal-doped TCO material contains at least one metal dopant (e.g., Ti, W, Mo, or Zr), oxygen, optionally hydrogen, optionally fluorine, and at least two elements, such as cadmium, tin, indium, zinc, gallium, magnesium, titanium, aluminum, calcium, antimony, tungsten, molybdenum, niobium, tantalum, zirconium, or combinations thereof. Generally, the metal-doped TCO material contains at least two metallic elements as the base metal oxide and at least one metal dopant. In some examples, the metal-doped TCO material contains one or more binary oxide materials selected from cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, or combinations thereof. Examples of metal-doped multicomponent TCO binary compounds and binary solid solutions include $Cd_2SnO_4$:M', $CdIn_2O_4$:M', $CdSnO_3$:M', $ZnSnO_3$:M', $Zn_2SnO_4$:M', $ZnGa_2O_4$:M', $In_4Sn_3O_{12}$:M', $Zn_kIn_2O_{k+3}$:M' (k=2, 3, 7, 9, 11, 13, 15), $Ti_{(1-x)}M_xO_2$:M'(M=Nb or Ta, and 0<x<1), $MgIn_2O_4$:M', $12CaO.7Al_2O_3$:M', $Ga_{2-2x}In_{2x}O_3$:M', wherein 0<x<1, alloys thereof, derivatives thereof, doped variants thereof, or combinations thereof, and wherein the metal dopant M'=at least one metal dopant selected from titanium, tungsten, molybdenum, or zirconium.

In other examples, the metal-doped TCO material contains one or more ternary oxide materials selected from zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, or combinations thereof. Examples of metal-doped multicomponent TCO ternary compounds and ternary solid solutions include $Zn_{2-x}In_{2x}Sn_{1-x}O_4$:M' (x=0-1) (ZITO:M'), $Ga_{3-x}In_{5+x}Sn_2O_{16}$:M' (x=0-1), $In_{1-x}Ga_{1+x}O_3(ZnO)_k$:M' (x=0-1, and k=1, 2, 3), $In_{2-2x}Sn_xZn_xO_3$:M' (x=0-1), $nCd_2SnO_4.(1-n)CdIn_2O_4$:F, wherein 0<n<1, $In_{2-2x}Cd_xSn_xO_3$:M' (x=0-1), $Cd_{1-x}Sn_{1-x}In_{2x}O_3$:M' (x=0-1), $nZn_2SnO_4.(1-n)ZnGa_2O_4$:F, wherein 0<n<1, $In_{4+x}Sn_{3-2x}Sb_xO_{12}$:M' (x=0-1.5), alloys thereof, derivatives thereof, doped variants thereof, or combinations thereof, and wherein the metal dopant M'=at least one metal dopant selected from titanium, tungsten, molybdenum, or zirconium.

The method further provides that the metal-doped TCO material contains metal dopant atoms at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %. Optionally, the metal-doped TCO material contains atomic hydrogen at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %, and/or optionally contains atomic fluorine at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %. Generally, the metal-doped TCO material contains interstitial metal dopant atoms and optionally hydrogen and/or fluorine atoms disposed within the interstitial positions of the crystalline lattice. Additionally, the metal-doped TCO material may contain metal dopant atoms and optionally hydrogen and/or fluorine atoms that occupy atomic positions of the crystalline lattice.

Figure 1:
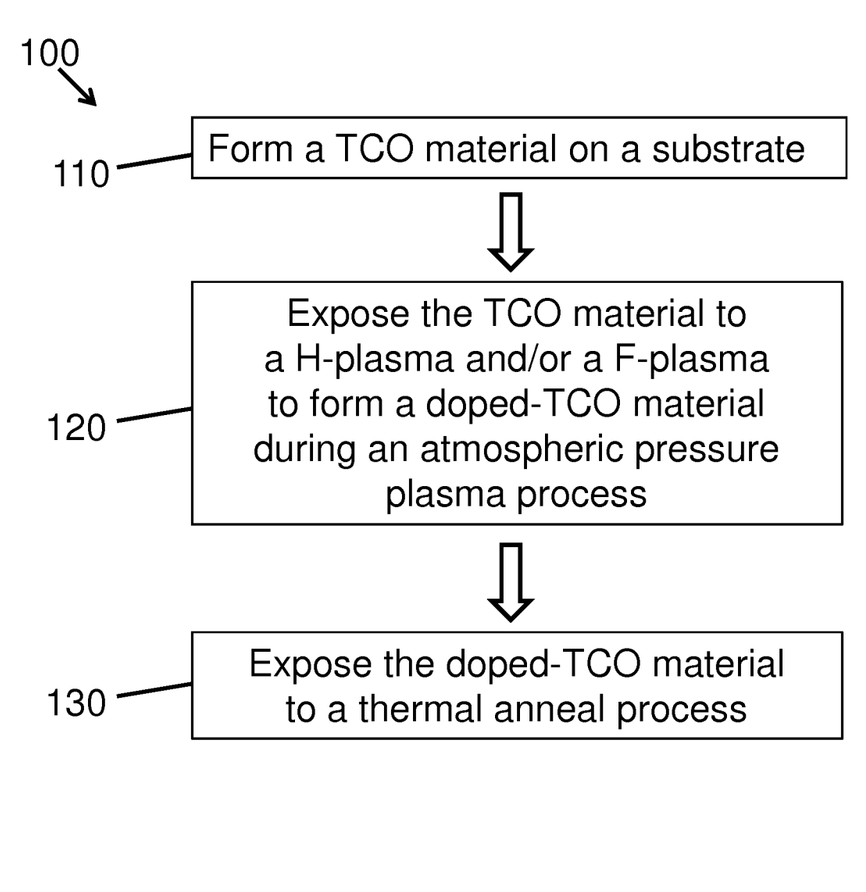
FIG. 1 is a flowchart depicting exemplary fabrication processes for forming doped-TCO materials, as described by embodiments herein.

FIG. 1 is a flowchart depicting process 100 that may be utilized to fabricate or otherwise form hydrogen-doped TCO materials, fluorine-doped TCO materials, or hydrogen and fluorine-doped TCO materials, as described by embodiments herein. Step 110 of process 100 provides forming at least one TCO material on a substrate or on a layer disposed on the substrate. Step 120 of process 100 includes exposing the TCO material to a hydrogen plasma, a fluorine plasma, or both a hydrogen plasma and a fluorine plasma to respectively form a hydrogen-doped TCO material, a fluorine-doped TCO material, or a hydrogen and fluorine-doped TCO material during at least one atmospheric plasma process. Step 130 of process 100 includes exposing the doped TCO material to a thermal annealing process, such as a rapid thermal process (RTP), which may include a thermal plasma discharge, IR lamp, UV lamp or UV laser heating.

During step 110, the TCO materials may be formed on a layer or substrate by one or multiple deposition processes including solid-state, liquid/solution, gaseous, and plasma processes. In some examples, the TCO materials may be formed by a sol-gel process wherein a precursor solution is applied to the substrate or underlying layer by dip coating, spin coating, ultrasonic spray deposition, aerosol deposition, roll coating, flow coating or meniscus coating to produce cured coatings on substrates such as glass (for displays and photovoltaic devices) or silicon wafers (for heterojunction silicon PV). Curing of the deposited precursor solution occurs via hydrolysis and condensation reactions between the precursor and water present in the solution and absorbed from the atmosphere, producing a gel containing of a continuous network of metal oxides (e.g., TCO materials) and a liquid phase contains solvent, water, and hydrolysis products, as described herein by some examples at step 110.

Exemplary liquid/solution deposition processes to form the TCO materials include sol-gel, metal salts solutions, chemical bath deposition, electroless deposition, electrochemical deposition, nanoparticle deposition, decomposition of organic-metallic compounds, and spray pyrolysis. Exemplary gaseous or plasma deposition processes to form the TCO materials include physical vapor deposition (PVD), sputtering, evaporation, pulsed laser deposition, atomic layer deposition (ALD), plasma-enhanced ALD (PE-ALD), chemical vapor deposition (CVD), plasma-enhanced CVD (PE-CVD).

The TCO materials and thin films can be deposited or otherwise formed via one of many conventional techniques for depositing conventional TCO materials or thin films, including sputtering, evaporation, CVD, spray pyrolysis, dip coating, flow coating, inkjet coating, and plasma coating. Hydrogen and/or hydrogen precursor source compounds, as well as, fluorine, and/or fluorine precursor source compounds may be introduced during—but are generally introduced subsequent to the TCO film deposition, such as during step 120. As described in embodiments herein, fluorine and hydrogen dopings utilizing APPs may be applied to both conventional TCOs and multicomponent TCOs.

In one embodiment of the invention, atmospheric pressure plasma (APP) processing using process gas mixtures of hydrogen gas ($H_2$), noble gases (He, Ar, Ne, Xe), nitrogen gas ($N_2$), or mixtures thereof introduced into the low-electron temperature plasma and/or afterglow zone of the APP discharge may be used to incorporate chemically active hydrogen into TCO materials or thin films at step 120. The APP process provides for rapid, low cost processing (H-doping) of the TCO film under ambient conditions in an inline manufacturing process using a variety of commercially available atmospheric plasma tools that heat the TCO film to a temperature within a range from about 25° C. to about 200° C. which does not affect the underlying substrate, allowing for the process to be use on TCO materials or thin films on glass or polymeric substrates. Therefore, the APP process does not chemical, thermal, optical, or mechanical change to the underlying substrate by providing a minimal penetration of heat or chemically active species from plasma discharge into the substrate through the overlying film.

The hydrogen-containing APP treatments to TCO materials or thin films, either in the as-deposited condition or after the TCO material or thin film has undergone other processing (heat treatment, other plasma treatments, curing of solution precursors, etc.), incorporates hydrogen into the thin TCO film for improvement of the electronic and optical properties as well and environmental stability of the TCO. In step 110, the method of producing the TCO materials or thin films include, but are not limited to, solution deposition methods (sol-gel, metal salts, chemical bath deposition, nanoparticle deposition, decomposition of organic-metallic compounds), sputtering, evaporation, pulsed laser deposition, ALD, CVD, and spray pyrolysis. A low-temperature (about 25° C. to about 200° C.) plasma source using a noble gas to create the plasma may be used for this purpose, including, but not limited to atmospheric plasma jet (APJ), dielectric barrier discharge (DBD), hollow cathode (HC), fused hollow cathode (FHC), hybrid hollow cathode (electrode-activated, RF, or microwave), corona discharge (CD), or cold plasma torch (CPT). Thermally energetic (T>200° C.) atmospheric plasma sources using noble gas plasmas may also be used for the APP process for simultaneous heating and hydrogen incorporation. Thermal atmospheric plasma sources including, but not limited to plasma torches, RF and microwave hollow cathode or hybrid electrode (e.g., hybrid hollow cathode enhanced atmospheric discharge (H-HEAD)), transfer arc, and any other source which produces a directional plasma discharge may be utilized.

Passage of hydrogen molecules (e.g., $H_2$ or other hydrogen source) and/or fluorine molecules (e.g., $F_2$ or other fluorine source) through the plasma discharge or afterglow chemically activates the hydrogen/fluorine, allowing the atomic hydrogen/fluorine to react in the TCO host and provide beneficial modification of the TCO properties in a controllable fashion. The hydrogen and/or fluorine plasma treated TCO materials or thin films may be subjected to further thermal, chemical, plasma, or other processing during step 130 in order to optimize the effects of hydrogen incorporation or to provide other benefit. APP processing has advantages over conventional doping methods for TCO materials or thin films, since APP may be performed under ambient or near ambient conditions on a rapidly moving substrate, without the need for costly vacuum processing or slow batch furnace annealing, which greatly reduces the cost of the process while allowing rapid inline processing of the TCO materials or thin films.

Therefore, in some embodiments described herein, process 100, a method for fabricating a TCO containing hydrogen on a substrate surface, is provided and includes forming a TCO material on a substrate (step 110), exposing the TCO material to a hydrogen plasma while forming a hydrogen-doped TCO material during an APP process (step 120), wherein the hydrogen-doped TCO material contains atomic hydrogen at a concentration within a range from about 1 at % (atomic percent) to about 30 at %, and exposing the hydrogen-doped TCO material to a thermal annealing process (step 130). Generally, during the APP process, the TCO material is exposed to the hydrogen plasma at a pressure within a range from about 0.90 atm to about 1.10 atm and more narrowly within a range from about 0.95 atm to about 1.05 atm, such as about 1 atm or at ambient pressure.

In some examples, the method further provides that the hydrogen-doped TCO material contains hydrogen, oxygen, and at least two elements, such as cadmium, tin, indium, zinc, gallium, magnesium, titanium, aluminum, calcium, antimony, tungsten, molybdenum, niobium, tantalum, zirconium, or combinations thereof. Generally, the hydrogen-doped TCO material contains at least two metallic elements. In some examples, the hydrogen-doped TCO material contains one or more binary oxide materials selected from cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, or combinations thereof. In other examples, the hydrogen-doped TCO material contains one or more ternary oxide materials selected from zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, or combinations thereof.

The method may also provide that the hydrogen-doped TCO material generally contains atomic hydrogen at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %. Generally, the hydrogen-doped TCO material contains interstitial atomic hydrogen, such as hydrogen atoms disposed within the interstitial positions of the crystalline lattice. Additionally, the hydrogen-doped TCO material contains hydrogen atoms that occupy atomic positions of the crystalline lattice.

In some embodiments of the method, the hydrogen plasma may be formed from a process gas containing hydrogen gas and at least one or more gases, such as argon, helium, neon, xenon, nitrogen, forming gas, or mixtures thereof. The process gas generally contains hydrogen gas at a concentration within a range from about 0.001 at % to about 30 at %, more narrowly within a range from about 0.1 at % to about 10 at %, and more narrowly within a range from about 1 at % to about 5 at %. In some examples, a thermal APP process is utilized to form the hydrogen-doped TCO materials. In other examples, a non-thermal APP process is utilized to form the hydrogen-doped TCO materials.

During an APP process to form a hydrogen-doped TCO material, the hydrogen plasma may be maintained at a pressure within a range from about 0.85 atm (standard atmosphere) to about 1.20 atm, more narrowly within a range from about 0.90 atm to about 1.10 atm, more narrowly within a range from about 0.95 atm to about 1.05 atm, more narrowly within a range from about 0.97 atm to about 1.03 atm, more narrowly within a range from about 0.98 atm to about 1.02 atm, and more narrowly within a range from about 0.99 atm to about 1.01 atm, such as about 1 atm. The APP process may be a thermal plasma process or alternatively, may be a non-thermal plasma process. Generally, the plasma generator source may be a radio frequency (RF) generator source or a microwave (MW) generator source, but may also be another type of plasma generator source. The plasma generator may be set to have a power output within a range from about 0.1 kilowatt (kW) to about 40 kW while igniting or otherwise forming a hydrogen plasma from the process gas.

The process gas containing the hydrogen gas may be administered or otherwise exposed to the TCO material at a flow rate within a range from about 10 sccm to about 500 sccm, more narrowly within a range from about 20 sccm to about 400 sccm, and more narrowly within a range from about 50 sccm to about 100 sccm, for example, about 100 sccm. The flow of the process gas containing the hydrogen gas may be maintained or adjusted before igniting a plasma. The TCO material—generally disposed no a substrate—may be exposed to the hydrogen plasma for a time period within a range from about 0.1 seconds to about 100 seconds, more narrowly within a range from about 0.5 seconds to about 20 seconds, more narrowly within a range from about 1 second to about 10 seconds, and more narrowly within a range from about 2 seconds to about 8 seconds.

In some examples, an RF generator may be set at a frequency within a range from about 100 KHz to about 1.6 MHz. In one example, an RF generator, with a frequency of 13.56 MHz, may be set to have a power output within a range from about 100 watts to about 1,000 watts, more narrowly within a range from about 250 watts to about 600 watts, and more narrowly within a range from about 300 watts to about 500 watts. In another example, an RF generator, with a frequency of 400 KHz, may be set to have a power output within a range from about 200 watts to about 2,000 watts, more narrowly within a range from about 500 watts to about 1,500 watts. The TCO material may be exposed to the hydrogen plasma having a power per surface area value within a range from about 0.01 watts/cm$^2$ to about 10.0 watts/cm$^2$, more narrowly within a range from about 0.05 watts/cm$^2$ to about 6.0 watts/cm$^2$.

Hydrogen Doping of Indium (III) Oxide Thin Film to Form a High Mobility TCO Using Hydrogen-Containing Low Temperature Atmospheric Plasma Discharges Hydrogen-doped indium (III) oxide (In$_2$O$_3$:H, IO:H or IHO) is a relatively new and novel high carrier mobility ($\mu$>80 cm$^2$V$^{-1}$s$^{-1}$) TCO with low resistivity (typically from about 3×10$^{-4}$ ohm·cm to about 5×10$^{-4}$ ohm·cm) and high transparency (about 90%) in the visible and near-infrared (NIR) wavelengths for carrier concentrations (N) about 1×10$^{20}$ cm$^{-3}$ in radio frequency sputter deposited films hydrogen-doped in situ using water vapor as the hydrogen source. In one embodiment, an alternative method is provided to produce IHO thin films on glass substrates at atmospheric pressure using solution deposition techniques to deposit the indium oxide thin film and APP to incorporate atomic hydrogen into the TCO film to create IHO thin film for TCO applications.

High quality indium (III) oxide thin films may be prepared via the sol-gel process using solution of precursors including, but not limited to indium (III) carboxylates (In(OOR)$_3$, wherein each R is independently an alkyl group or an aryl group, for example, R=—CH, —C$_2$H$_3$, —C$_n$H$_{n+1}$, wherein n=1-12) indium (III) alkoxides (In(OR)$_3$, wherein each R is independently an alkyl group or an aryl group, for example, R=C$_n$H$_{n+2}$, wherein n=1-8) in solvents such as ethanol or 2-methoxyethanol. The indium oxide precursor solution may be deposited by dip coating, spin coating, ultrasonic spray deposition, aerosol deposition, roll coating, flow coating or meniscus coating to produce cured coatings that are crack-free up to several hundred nanometers thick on substrates such as glass (for displays and photovoltaics) or silicon wafers (for heterojunction silicon PV). Curing of the deposited precursor solution occurs via hydrolysis and condensation reactions between the indium oxide precursor and water present in the solution and absorbed from the atmosphere, producing a gel containing of a continuous network of In—O and a liquid phase contains solvent, water and hydrolysis products. The liquid phase is removed by evaporation, typically assisted by heating the TCO film. The TCO film may be heated to a temperature within a range from about 50° C. to about 300° C., more narrowly within a range from about 100° C. to about 200° C. Generally, the TCO film is heated and the liquid phase is evaporated by IR lamps or contact heating, which also promotes hydrolysis and condensation of the unreacted carboxylate or alkoxide groups. The resulting film contains amorphous indium oxide with retained carboxylate or alkoxide and chemisorbed water which may be removed through heating to temperatures sufficient to dehydrate the TCO film and pyrolyze the remaining organics (>200° C.), or by exposure to chemically active oxygen species using APP or UV or UV-ozone treatment. The UV or UV-ozone treatment can be accomplished via low or high intensity UV lamps or UV lasers, which not only help break down molecular bonds but also provide heat to the TCO film. The amorphous indium oxide film ($\alpha$-IO) is then doped with chemically active hydrogen by exposing the TCO film to an hydrogen-containing (H<5%) noble gas APP such as atmospheric plasma jet or a dielectric barrier discharge (DBD) if low temperature doping (T<300° C.) is desired and a thermal APP such as high power RF or microwave plasma discharge or high power DBD if doping while also crystallizing and sintering are desired (T>300° C.). A crystallized and annealed film may also be produced by rapid thermal processing of the low temperature APP H-doped In$_2$O$_3$ film (IHO) using IR lamp heating or heating by exposure to a thermal plasma discharge. Controlled H-doping is achieved by adjusting the hydrogen concentration in the gas mixture, the power of the plasma source, the distance of the plasma discharge from the TCO film surface, and the dwell time of the plasma discharge on the surface. Doping rates and hydrogen reactivity will also be affected by the type of plasma source selected and the temperature of the TCO film due to heating by the plasma. This process provides the production of amorphous or crystalline IHO thin films.

Example 1

A Method for Producing Crystalline IHO Thin Films for TCO Applications

Deposit a solution of an indium oxide precursor solution such as indium (III) acetate or indium (III) formate in ethanol on to a substrate (glass, Si) to form a uniform coating by ultrasonic spray deposition, aerosol deposition, dip coating or any other solution deposition technique.

Cure, dry and decompose the organics in the TCO film by passing the TCO film through oxygen containing APP discharge (APJ or DBD) at a process temperature within a range from about 100° C. to about 400° C.

Incorporate hydrogen into the indium oxide film by passing the TCO film through a low-temperature (a temperature within a range from about 20° C. to about 200° C.) APP discharge containing a concentration of hydrogen (H$_2$) within a range from about 0.001% to about 5% by volume (below flammable concentration) in argon or helium using APJ or DBD plasma.

Rapid thermal process (RTP) the TCO film to achieve the desired degree of crystallinity and film density by scanning with a thermal plasma discharge or IR lamp heating. An RTP system can contain of high-intensity UV lamps which can be pulsed or continuous.

Example 2

A Method for Producing Crystalline IHO Thin Films for TCO Applications

Deposit a solution of an indium oxide precursor solution such as indium (III) acetate or indium (III) formate in ethanol on to a substrate (glass, Si) to form a uniform coating by ultrasonic spray deposition, aerosol deposition, dip coating or any other solution deposition technique.

Cure, dry and decompose the organics in the TCO film while simultaneously incorporating hydrogen into the indium oxide by passing the TCO film through a hydrogen-containing APP discharge containing a concentration of hydrogen ($H_2$) within a range from about 0.001% to about 5% by volume (below flammable concentration) in argon or helium using APJ or DBD plasma.

RTP the TCO film to achieve the desired degree of crystallinity and film density by scanning with a thermal plasma discharge (air, oxygen-argon), IR lamp, UV lamp or UV laser heating.

Hydrogen Doping of Other Transparent Conducting Oxides Using Low Temperature Hydrogen-Containing Atmospheric Plasma Discharges

Example 3

A Method for Producing Crystalline Hydrogen-Doped Aluminum Zinc Oxide (AZO:H) Thin Films for TCO Applications Deposit a solution of an aluminum doped (about 0.1% to about 5% Al substitution for Zn) zinc oxide precursor solution such as zinc (II) acetate and aluminum (III) nitrate in ethanol on to a substrate (glass, Si) to form a uniform coating by ultrasonic spray deposition, aerosol deposition, dip coating or any other solution deposition technique.

Cure, dry and decompose the organics in the TCO film by passing the TCO film through oxygen containing APP discharge (APJ or DBD) at a process temperature within a range from about 100° C. to about 400° C.

Incorporate hydrogen into the indium oxide film by passing the TCO film through a low-temperature (a temperature within a range from about 20° C. to about 200° C.) APP discharge containing a concentration of hydrogen ($H_2$) within a range from about 0.001% to about 5% by volume (below flammable concentration) in argon or helium using APJ or DBD plasma.

RTP the TCO film to achieve the desired degree of crystallinity and film density by scanning with a thermal plasma discharge, IR lamp, UV lamp or UV laser heating.

Example 4

A Method for Producing Crystalline Hydrogen-Doped Tin Doped Indium Oxide (ITO:H) Thin Films for TCO Applications Deposit a solution of an tin doped indium (III) oxide precursor solution such as indium (III) acetate and tin (II) chloride (about 1% to about 15% by weight Sn substitution for In) in ethanol on to a substrate (glass, Si) to form a uniform coating by ultrasonic spray deposition, aerosol deposition, dip coating or any other solution deposition technique. Addition of a chelating stabilizer such as acetylacetone, 2-aminoethanol or diethylamine may be used to enhance solution stability and precursor solubility.

Cure and dry and remove organics from the TCO film by passing the TCO film through oxygen containing APP discharge (APJ or DBD) at a process temperature within a range from about 100° C. to about 400° C.

Incorporate hydrogen into the indium tin oxide film by passing the TCO film through a low-temperature (a temperature within a range from about 20° C. to about 200° C.) APP discharge containing a concentration of hydrogen ($H_2$) within a range from about 0.001% to about 5% by volume (below flammable concentration) in argon or helium using APJ or DBD plasma.

Rapid Thermal Process (RTP) the TCO film to achieve the desired degree of crystallinity and film density by scanning with a thermal plasma discharge, IR lamp, UV lamp or UV laser heating.

Example 5

A Method for Producing Amorphous Hydrogen-Doped Tin Doped Indium Oxide (α-ITO:H) Thin Films for TCO Applications Deposit a solution of an tin doped indium (III) oxide precursor solution such as indium (III) acetate and tin (II) chloride (about 1% to about 15% by weight Sn substitution for In) in ethanol on to a substrate (glass, Si) to form a uniform coating by ultrasonic spray deposition, aerosol deposition, dip coating or any other solution deposition technique. Addition of a chelating stabilizer such as acetylacetone, 2-aminoethanol or diethylamine may be used to enhance solution stability and precursor solubility.

Incorporate hydrogen into the indium tin oxide film by passing the TCO film through a low-temperature (a temperature within a range from about 20° C. to about 200° C.) APP discharge containing a concentration of hydrogen ($H_2$) within a range from about 0.001% to about 5% by volume (below flammable concentration) in argon or helium using APJ or DBD plasma.

Complete oxidization of residual organics and improve oxygen stoichiometry of the indium tin oxide film by passing the TCO film through a low-temperature (a temperature within a range from about 20° C. to about 200° C.) oxygen containing APP discharge containing using APJ or DBD plasma. Low processing temperature will prevent crystallization by inhibiting diffusion of cations.

Preparation of Hydrogen-Doped TCOs Using Hydrogen-Containing Thermal Plasmas

Example 6

A Method for Producing Hydrogen-Doped Crystalline Tin Doped Indium Oxide Thin Films for TCO Applications Deposit a solution of an tin doped indium (III) oxide precursor solution such as indium (III) acetate and tin (II) chloride (about 1% to about 15% by weight Sn substitution for In) in ethanol on to a substrate (glass, Si) to form a uniform coating by ultrasonic spray deposition, aerosol deposition, dip coating or any other solution deposition technique. Addition of a chelating stabilizer such as acetylacetone, 2-aminoethanol or diethylamine may be used to enhance solution stability and precursor solubility.

Cure and dry the TCO film by IR heating (a temperature within a range from about 5° C. to about 30° C.).

Incorporate hydrogen while decomposing organics, crystallize and sinter the TCO film using a hydrogen-containing (<3% vol $H_2$ in Ar or He) thermal plasma discharge (surface temperature may be within a range from about 250° C. to about 2,000° C., such as within a range from about 300° C. to about 1,500° C.) such as RF or microwave plasma torch.

Improve oxygen stoichiometry of film and remove molecular hydrogen using a low-temperature (a temperature within a range from about 20° C. to about 200° C.) oxygen containing APP discharge containing using APJ or DBD plasma.

Alternatively, the density of the TCO film may be increased to further improve the oxygen stoichiometry using oxygen containing thermal plasma discharge such as an air plasma torch or oxygen-argon plasma torch.

Example 7

A Method for Producing Hydrogen-Doped Crystalline Indium Doped Zinc Oxide Thin Films for TCO Applications Deposit a solution of an indium doped zinc (II) oxide precursor solution such as zinc (II) acetate and indium (III) chloride (0.1%-10% In substitution for Zn) in ethanol on to a substrate (glass, Si) to form a uniform coating by ultrasonic spray deposition, aerosol deposition, dip coating or any other solution deposition technique. Addition of a chelating stabilizer such as acetylacetone, 2-aminoethanol or diethanolamine may be used to enhance solution stability and precursor solubility.

Cure and dry the TCO film by IR heating (a temperature within a range from about 30° C. to about 500° C., such as within a range from about 50° C. to about 300° C.).

Incorporate hydrogen while decomposing organics, crystallize and sinter the TCO film using a hydrogen-containing (<3% vol $H_2$ in Ar or He) thermal plasma discharge (surface temperature may be within a range from about 250° C. to about 2,000° C., such as within a range from about 300° C. to about 1,500° C.) such as RF or microwave plasma torch.

Improve oxygen stoichiometry of film and remove molecular hydrogen using a low-temperature (a temperature within a range from about 20° C. to about 200° C.) oxygen containing APP discharge containing using APJ or DBD plasma.

Alternatively, the density of the TCO film may be increased to further improve the oxygen stoichiometry using oxygen containing thermal plasma discharge such as an air plasma torch or oxygen-argon plasma torch.

In another embodiment of the invention, APP may be used to produce chemically active atomic fluorine which is utilized to form fluorine-doped TCO materials or thin films. Generally, the fluorine-doped TCO materials or thin films are formed at ambient temperature and pressure and with minimal heating of the TCO film or substrate (e.g., a temperature within a range from about 40° C. to about 200° C.). In some examples, the deposition and APP steps may be performed as an inline process. The combination of effective activation of low levels of fluorine dopant improves the mobility and transparency of the TCO due to reducing the number of scattering sites (F-interstitials) and reducing the free carrier absorption (FCA), while the lack of vacuum processing and substrate heating greatly reduces the cost of the process and increasing the speed and efficiency of manufacturing. Fluorine is also beneficial to improving the stability of TCO materials based on ZnO against degradation by oxygen or water through passivation of the grain boundaries and free surfaces.

The use of APP discharges containing a source of fluorine to dope TCO materials or thin films by exposing the TCO material or thin film to plasma discharge. The TCO materials or thin films may be on a variety of substrates, including polymers, due to the low thermal temperature of the plasma (a temperature within a range from about 20° C. to about 200° C.) and the effective transfer of energy and chemically active species to the TCO thin film. APP discharges suitable for this task include, but are not limited to atmospheric plasma jet (APJ), dielectric barrier discharge (DBD), fused hollow cathode (FHC), hybrid hollow cathode enhanced atmospheric discharge (H-HEAD), and corona discharge (CD). The plasma generally contains a noble gas discharge (He, Ar, Ne, Xe) or air, with the chemically active species of interest being introduced into the plasma discharge or the afterglow region of the plasma. Fluorine sources for doping using APP discharges may include, but are not limited to $F_2$, $CF_4$, $CF_4$, HF, $SO_2F_2$, $CH_2F_2$, $CH_3F$, $F_2O$, $SF_6$, $S_2F_{10}$, $N_2F_4$, and $NH_4F$, which may be mixed with other species to produce the desired reactants.

Therefore, in other embodiments described herein, process 100, a method for fabricating a TCO containing fluorine on a substrate surface, is provided and includes forming a TCO material on a substrate (step 110), exposing the TCO material to a fluorine plasma while forming a fluorine-doped TCO material during an APP process (step 120), wherein the fluorine-doped TCO material contains atomic fluorine at a concentration within a range from about 1 at % to about 30 at %, and exposing the fluorine-doped TCO material to a thermal annealing process (step 130). Generally, during the APP process, the TCO material is exposed to the fluorine plasma at a pressure within a range from about 0.90 atm to about 1.10 atm and more narrowly within a range from about 0.95 atm to about 1.05 atm, such as about 1 atm or at ambient pressure.

In some examples, the method further provides that the fluorine-doped TCO material contains fluorine, oxygen, and at least two elements, such as cadmium, tin, indium, zinc, gallium, magnesium, titanium, aluminum, calcium, antimony, tungsten, molybdenum, niobium, tantalum, zirconium, or combinations thereof. Generally, the fluorine-doped TCO material contains at least two metallic elements. In some examples, the fluorine-doped TCO material contains one or more binary oxide materials selected from cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, or combinations thereof. In other examples, the fluorine-doped TCO material contains one or more ternary oxide materials selected from zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, or combinations thereof.

The method also provides that the fluorine-doped TCO material contains atomic fluorine at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %. Generally, the fluorine-doped TCO material contains interstitial atomic fluorine, such as fluorine atoms disposed within the interstitial positions of the crystalline lattice. Additionally, the fluorine-doped TCO material contains fluorine atoms that occupy atomic positions of the crystalline lattice.

In some embodiments of the method, the fluorine plasma may be formed from a process gas containing fluorine gas and at least one or more gases, such as argon, helium, neon, xenon, nitrogen, forming gas, or mixtures thereof. The process gas generally contains fluorine gas at a concentration within a range from about 0.001 at % to about 30 at %, more narrowly within a range from about 0.1 at % to about 10 at %, and more narrowly within a range from about 1 at % to about 5 at %. In some examples, a thermal APP process is utilized to form the fluorine-doped TCO materials. In other examples, a non-thermal APP process is utilized to form the fluorine-doped TCO materials.

During an APP process to form a fluorine-doped TCO material, the fluorine plasma may be maintained at a pressure within a range from about 0.85 atm (standard atmosphere) to about 1.20 atm, more narrowly within a range from about 0.90 atm to about 1.10 atm, more narrowly within a range from about 0.95 atm to about 1.05 atm, more narrowly within a range from about 0.97 atm to about 1.03 atm, more narrowly within a range from about 0.98 atm to about 1.02 atm, and more narrowly within a range from about 0.99 atm to about 1.01 atm, such as about 1 atm. The APP process may be a thermal plasma process or alternatively, may be a non-thermal plasma process. Generally, the plasma generator source may be an RF generator source or a MW generator source, but may also be another type of plasma generator source. The plasma generator may be set to have a power output within a range from about 0.1 kW to about 40 kW while igniting or otherwise forming a fluorine plasma from the process gas.

The process gas containing the fluorine source or gas may be administered or otherwise exposed to the TCO material at a flow rate within a range from about 10 sccm to about 500 sccm, more narrowly within a range from about 20 sccm to about 400 sccm, and more narrowly within a range from about 50 sccm to about 100 sccm, for example, about 100 sccm. The flow of the process gas containing the fluorine gas may be maintained or adjusted before igniting a plasma. The TCO material—generally disposed no a substrate—may be exposed to the fluorine plasma for a time period within a range from about 0.1 seconds to about 200 seconds, more narrowly within a range from about 0.5 seconds to about 20 seconds, more narrowly within a range from about 1 second to about 10 seconds, and more narrowly within a range from about 2 seconds to about 8 seconds.

In some examples, an RF generator may be set at a frequency within a range from about 100 KHz to about 1.6 MHz. In one example, an RF generator, with a frequency of 13.56 MHz, may be set to have a power output within a range from about 100 watts to about 1,000 watts, more narrowly within a range from about 250 watts to about 600 watts, and more narrowly within a range from about 300 watts to about 500 watts. In another example, an RF generator, with a frequency of 400 KHz, may be set to have a power output within a range from about 200 watts to about 2,000 watts, more narrowly within a range from about 500 watts to about 1,500 watts. The TCO material may be exposed to the fluorine plasma having a power per surface area value within a range from about 0.01 watts/cm$^2$ to about 10.0 watts/cm$^2$, more narrowly within a range from about 0.05 watts/cm$^2$ to about 6.0 watts/cm$^2$.

APP Discharge Containing a Fluorine Source to Fluorine-Dope Zinc Oxide-Based TCOs Example 8

A Method for Doping of Aluminum Doped Zinc Oxide (AZO) with Fluorine Using an Atmospheric Plasma Jet Discharge Deposit a thin film of AZO ($Al_xZn_{1-x}O$, 0<x<0.20) using sol-gel methods such as dip coating or ultrasonic spray deposition of a solution precursor (e.g., zinc acetate or zinc acetylacetonate+aluminum nitrate in ethanol or water) on a glass substrate (passivated soda-lime or alkali-free borosilicate).

Cure the AZO film and remove retained solvent with mild heating (a temperature within a range from about 50° C. to about 150° C.) or by exposing the TCO film to an APP discharge containing oxygen or air (a temperature within a range from about 5° C. to about 40° C.).

Pass the cured AZO film through a cold (a temperature within a range from about 20° C. to about 200° C.) APP discharge containing a fluorine source to form a fluorine-doped TCO film.

Rapid thermal anneal the doped TCO film using IR lamps, UV lamps or UV lasers, or a plasma torch discharge to improve film crystallinity and displace interstitial fluorine.

Example 9

A Method for Doping of Gallium Doped Zinc Oxide (GZO) with Fluorine Using an Atmospheric Plasma Jet Discharge Deposit a thin film of GZO ($Ga_xZn_{1-x}O$, 0<x<0.20) using sol-gel methods such as dip coating or ultrasonic spray deposition of a solution precursor (e.g., zinc acetate or zinc acetylacetonate+gallium nitrate in ethanol or water) on a glass substrate (passivated soda-lime or alkali-free borosilicate).

Cure the GZO film and remove retained solvent with mild heating (a temperature within a range from about 50° C. to about 150° C.) or by exposing the TCO film to an APP discharge containing oxygen or air (a temperature within a range from about 5° C. to about 40° C.).

Pass the cured GZO film through a cold (a temperature within a range from about 20° C. to about 200° C.) APP discharge containing a fluorine source to form a fluorine-doped TCO film.

Rapid thermal anneal the doped TCO film using IR lamps, UV lamps or UV lasers, or a plasma torch discharge to improve film crystallinity and displace interstitial fluorine.

Example 10

A Method for Doping of Gallium Doped Zinc Oxide (GZO) or Aluminum Doped Zinc Oxide (AZO) with Fluorine and Hydrogen Using an Atmospheric Plasma Jet Discharge Deposit a thin film of GZO ($Ga_xZn_{1-x}O$, 0<x<0.20) or AZO ($Ga_xZn_{1-x}O$, 0<x<0.20) using sol-gel methods such as dip coating or ultrasonic spray deposition of a solution precursor (e.g., zinc acetate or zinc acetylacetonate+gallium nitrate or aluminum nitrate in ethanol or water) on a glass substrate (passivated soda-lime or alkali-free borosilicate).

Cure the AZO or GZO film and remove retained solvent with mild heating (a temperature within a range from about 50° C. to about 150° C.) or by exposing the TCO film to an APP discharge containing oxygen or air (a temperature within a range from about 5° C. to about 40° C.).

Pass the cured AZO or GZO film through a cold (a temperature within a range from about 20° C. to about 200° C.) APP discharge containing a fluorine and hydrogen source (e.g., HF, $H_2+CF_4$) to fluorine and hydrogen-doped the TCO film.

Rapid thermal anneal the doped TCO film using IR lamps, UV lamps or UV lasers, or a plasma torch discharge to improve film crystallinity and displace interstitial fluorine.

APP Discharge Containing a Fluorine Source to Fluorine-Dope Indium Oxide-Based TCOs Example 11

A Method for Doping of Multicomponent Zinc Indium Tin Oxide (ZITO) with Fluorine Using an Atmospheric Plasma Jet Discharge Deposit a thin film of ZITO ($Zn_xSn_yIn_zO$, x=0-0.90, y=0-0.9, z=0-0.9) using sol-gel methods such as dip coating or ultrasonic spray deposition of a solution precursor (e.g., zinc acetate or zinc acetylacetonate+tin chloride+indium acetate or formate in ethanol or water) on a glass substrate (passivated soda-lime or alkali-free borosilicate).

Cure the ZITO film and remove retained solvent with mild heating (a temperature within a range from about 50° C. to about 150° C.).

Expose the TCO film to an APP discharge containing oxygen or air (a temperature within a range from about 50° C. to about 400° C.).

Pass the cured ZITO film through a cold (a temperature within a range from about 20° C. to about 200° C.) APP discharge containing a fluorine source to form a fluorine-doped TCO film.

Subsequently, optionally exposed the doped TCO to a rapid thermal anneal process by using IR lamps, UV lamps or UV lasers, or a plasma torch discharge to displace interstitial fluorine and if crystallization of the TCO film is desired (non-polymeric substrates).

Example 12

A Method for Doping Indium Tin Oxide (ITO) with Fluorine Using an Atmospheric Plasma Jet Discharge Deposit a thin film of ITO ($Sn_xIn_{1-x}O$, x is within a range from about 0.001 to about 0.15) using sol-gel methods such as dip coating or ultrasonic spray deposition of a solution precursor (e.g., indium acetate or indium chloride+tin chloride in ethanol or water) on a glass substrate (passivated soda-lime or alkali-free borosilicate).

Cure the ITO film and remove retained solvent with mild heating (a temperature within a range from about 50° C. to about 150° C.).

Expose the TCO film to an APP discharge containing oxygen or air (a temperature within a range from about 50° C. to about 400° C.).

Pass the cured ITO film through a cold (a temperature within a range from about 20° C. to about 200° C.) APP discharge containing a fluorine source to form a fluorine-doped TCO film.

Subsequently, optionally exposed the doped TCO to a rapid thermal anneal process by using IR lamps, UV lamps or UV lasers, or a plasma torch discharge to displace interstitial fluorine and if crystallization of the TCO film is desired (non-polymeric substrates).

APP Discharge Containing a Fluorine Source to Fluorine-Dope Tin Oxide-Based TCOs Example 13

A Method for Doping of Gallium Doped Tin Oxide (GTO) with Fluorine Using an Atmospheric Plasma Jet Discharge Deposit a thin film of GTO ($Ga_xSn_{1-x}O$, x is within a range from about 0.001 to about 0.15) using sol-gel methods such as dip coating or ultrasonic spray deposition of a solution precursor (e.g., tin chloride, tin acetylacetonate, or tin butoxide+ gallium nitrate or gallium acetylacetonate in ethanol) on a glass substrate (passivated soda-lime or alkali-free borosilicate).

Cure the GTO film and remove retained solvent with mild heating (at a temperature within a range from about 50° C. to about 150° C.) or by exposing the TCO film to an APP discharge containing oxygen or air (a temperature within a range from about 5° C. to about 40° C.).

Pass the cured GTO film through a cold (a temperature within a range from about 20° C. to about 200° C.) APP discharge containing a fluorine source to form a fluorine-doped TCO film.

Rapid thermal anneal the doped TCO film using IR lamps, UV lamps or UV lasers, or a plasma torch discharge to improve film crystallinity and displace interstitial fluorine.

Example 14

A Method for Doping of Tungsten Doped Tin Oxide (WTO) with Fluorine Using an Atmospheric Plasma Let Discharge Deposit a thin film of WTO ($W_xSn_{1-x}O$, x is within a range from about 0.001 to about 0.10) using sol-gel methods such as dip coating or ultrasonic spray deposition of a solution precursor (e.g., tin chloride, tin acetylacetonate, or tin butoxide+ tungsten VI chloride or peroxytungstic acid in ethanol) on a glass substrate (passivated soda-lime or alkali-free borosilicate).

Cure the WTO film and remove retained solvent with mild heating (a temperature within a range from about 50° C. to about 150° C.) or by exposing the TCO film to an APP discharge containing oxygen or air at a temperature within a range from about 5° C. to about 40° C.

Pass the cured WTO film through a cold (a temperature within a range from about 20° C. to about 200° C.) APP discharge containing a fluorine source to form a fluorine-doped TCO film.

Rapid thermal anneal the doped TCO film using IR lamps, UV lamps or UV lasers, or a plasma torch discharge to improve film crystallinity and displace interstitial fluorine.

Therefore, in other embodiments described herein, process 100, a method for fabricating a TCO containing hydrogen and fluorine on a substrate surface, is provided and includes forming a TCO material on a substrate (step 110), exposing the TCO material to a hydrogen plasma, a fluorine plasma, or mixtures thereof while forming a hydrogen and fluorine-doped TCO material during at least one APP process (step 120), and exposing the fluorine-doped TCO material to a thermal annealing process (step 130). The hydrogen and fluorine-doped TCO material contains atomic hydrogen at a concentration within a range from about 1 at % to about 30 at % and atomic fluorine at a concentration within a range from about 1 at % to about 30 at %, In some examples, the method provides that the TCO material is exposed to the hydrogen plasma during a first APP process and subsequently exposed to the fluorine plasma during a second APP process. In the other examples, the method provides that the TCO material is exposed to the fluorine plasma during a first APP process and subsequently exposed to the hydrogen plasma during a second APP process. Alternatively, in other examples, the method provides that the TCO material is exposed to the hydrogen plasma and the fluorine plasma during a single APP process.

In some examples, the method further provides that the hydrogen and fluorine-doped TCO material contains hydrogen, fluorine, oxygen, and at least two elements, such as cadmium, tin, indium, zinc, gallium, magnesium, titanium, aluminum, calcium, antimony, tungsten, molybdenum, niobium, tantalum, zirconium, or combinations thereof. Generally, the hydrogen and fluorine-doped TCO material contains at least two metallic elements. In some examples, the hydrogen and fluorine-doped TCO material contains one or more binary oxide materials selected from cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, or combinations thereof. In other examples, the hydrogen and fluorine-doped TCO material contains one or more ternary oxide materials selected from zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, or combinations thereof.

The method further provides that the hydrogen and fluorine-doped TCO material contains atomic hydrogen at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %, and contains atomic fluorine at a concentration within a range from about 1 at % to about 30 at %, more narrowly within a range from about 2 at % to about 25 at %, more narrowly within a range from about 5 at % to about 20 at %, and more narrowly within a range from about 8 at % to about 12 at %, such as about 10 at %. Generally, the hydrogen-doped TCO material contains interstitial atomic hydrogen, such as hydrogen atoms disposed within the interstitial positions of the crystalline lattice. Additionally, the hydrogen-doped TCO material contains hydrogen atoms that occupy atomic positions of the crystalline lattice.

The hydrogen plasma may be formed from a process gas containing hydrogen gas at a concentration within a range from about 0.001 at % to about 30 at %, more narrowly within a range from about 0.1 at % to about 10 at %, and more narrowly within a range from about 1 at % to about 5 at %. The fluorine plasma may be formed from a process gas containing fluorine gas at a concentration within a range from about 0.001 at % to about 30 at %, more narrowly within a range from about 0.1 at % to about 10 at %, and more narrowly within a range from about 1 at % to about 5 at %. In some examples, a thermal APP process is utilized to form the hydrogen and fluorine-doped TCO materials. In other examples, a non-thermal APP process is utilized to form the hydrogen and fluorine-doped TCO materials.

During an APP process to form a hydrogen and fluorine-doped TCO material, the hydrogen and/or fluorine plasma may be maintained at a pressure within a range from about 0.85 atm (standard atmosphere) to about 1.20 atm, more narrowly within a range from about 0.90 atm to about 1.10 atm, more narrowly within a range from about 0.95 atm to about 1.05 atm, more narrowly within a range from about 0.97 atm to about 1.03 atm, more narrowly within a range from about 0.98 atm to about 1.02 atm, and more narrowly within a range from about 0.99 atm to about 1.01 atm, such as about 1 atm. The APP process may be a thermal plasma process or alternatively, may be a non-thermal plasma process. Generally, the plasma generator source may be an RF generator source or a MW generator source, but may also be another type of plasma generator source. The plasma generator may be set to have a power output within a range from about 0.1 kW to about 40 kW while igniting or otherwise forming a hydrogen and/or fluorine plasma from the process gas.

The process gas containing the hydrogen and/or fluorine gas may be administered or otherwise exposed to the TCO material at a flow rate within a range from about 10 sccm to about 500 sccm, more narrowly within a range from about 20 sccm to about 400 sccm, and more narrowly within a range from about 50 sccm to about 100 sccm, for example, about 100 sccm. The flow of the process gas containing the hydrogen and/or fluorine gas may be maintained or adjusted before igniting a plasma. The TCO material—generally disposed no a substrate—may be exposed to the hydrogen and/or fluorine plasma for a time period within a range from about 0.1 seconds to about 200 seconds, more narrowly within a range from about 0.5 seconds to about 20 seconds, more narrowly within a range from about 1 second to about 10 seconds, and more narrowly within a range from about 2 seconds to about 8 seconds.

In some examples, an RF generator may be set at a frequency within a range from about 100 KHz to about 1.6 MHz. In one example, an RF generator, with a frequency of 13.56 MHz, may be set to have a power output within a range from about 100 watts to about 1,000 watts, more narrowly within a range from about 250 watts to about 600 watts, and more narrowly within a range from about 300 watts to about 500 watts. In another example, an RF generator, with a frequency of 400 KHz, may be set to have a power output within a range from about 200 watts to about 2,000 watts, more narrowly within a range from about 500 watts to about 1,500 watts. The TCO material may be exposed to the hydrogen and/or fluorine plasma having a power per surface area value within a range from about 0.01 watts/cm$^2$ to about 10.0 watts/cm$^2$, more narrowly within a range from about 0.05 watts/cm$^2$ to about 6.0 watts/cm$^2$.

While the foregoing is directed to embodiments of the invention, other and further embodiments of the invention may be devised without departing from the basic scope thereof, and the scope thereof is determined by the claims that follow.

The invention claimed is:

1. A composition of a hydrogen and fluorine-doped transparent conductive oxide material, comprising:
   an oxide of at least two elements selected from the group consisting of cadmium, tin, indium, zinc, gallium, magnesium, titanium, aluminum, calcium, antimony, tungsten, molybdenum, niobium, tantalum, zirconium, and combinations thereof;
   atomic hydrogen at a concentration within a range from about 5 atomic percent to about 15 atomic percent; and
   atomic fluorine at a concentration within a range from about 5 atomic percent to about 15 atomic percent.

2. The composition of claim 1, wherein the oxide of at least two elements is a binary oxide selected from the group consisting of cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, and combinations thereof.

3. The composition of claim 1, wherein the oxide of at least two elements is a ternary oxide selected from the group consisting of zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, and combinations thereof.

4. The composition of claim 1, wherein the concentration of atomic hydrogen is 5 to 15 atomic percent and the concentration of atomic fluorine is 5 to 15 atomic percent.

5. The composition of claim 4, wherein the oxide of at least two elements is a binary oxide selected from the group consisting of cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, and combinations thereof.

6. The composition of claim 4, wherein the oxide of at least two elements is a ternary oxide selected from the group consisting of zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, and combinations thereof.

7. A method for fabricating a transparent conductive oxide composition of claim 1, said method comprising:
   providing a transparent conductive oxide material on a substrate;
   exposing the transparent conductive oxide material to a hydrogen plasma and a fluorine plasma at an atmospheric pressure of at least one atmosphere to provide a doped transparent conductive oxide material; and
   exposing the doped transparent conductive oxide material to a thermal annealing process to form the transparent conductive oxide composition.

8. The method of claim 7, wherein the oxide of at least two elements is a binary oxide selected from the group consisting of cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, and combinations thereof.

9. The method of claim 7, wherein the oxide of at least two elements is a ternary oxide selected from the group consisting of zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, and combinations thereof.

10. The method of claim 7, wherein the transparent conductive oxide material is exposed to the hydrogen plasma at a pressure within a range from about 0.90 atm to about 1.10 atm during the atmospheric pressure plasma process.

11. The method of claim 7, wherein the hydrogen plasma is formed from a process gas comprising hydrogen gas at a concentration within a range from about 0.001 atomic percent to about 30 atomic percent.

12. The method of claim 11, wherein the process gas further comprises a gas selected from the group consisting of argon, helium, neon, xenon, nitrogen, and mixtures thereof, and the concentration of the hydrogen gas within a range from about 0.1 atomic percent to about 10 atomic percent.

13. The method of claim 7, wherein the transparent conductive oxide material is exposed to the hydrogen plasma during a first atmospheric pressure plasma process and subsequently exposed to the fluorine plasma during a second atmospheric pressure plasma process or the transparent conductive oxide material is exposed to the fluorine plasma during a first atmospheric pressure plasma process and subsequently exposed to the hydrogen plasma during a second atmospheric pressure plasma process.

14. The method of claim 10, wherein the oxide of at least two elements is a binary oxide selected from the group consisting of cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, and combinations thereof.

15. The method of claim 11, wherein the oxide of at least two elements is a binary oxide selected from the group consisting of cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, and combinations thereof.

16. The method of claim 12, wherein the oxide of at least two elements is a binary oxide selected from the group consisting of cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, and combinations thereof.

17. The method of claim 13, wherein the oxide of at least two elements is a binary oxide selected from the group consisting of cadmium tin oxide, cadmium indium oxide, zinc tin oxide, zinc gallium oxide, indium tin oxide, zinc indium oxide, titanium niobium oxide, titanium tantalum oxide, magnesium indium oxide, calcium aluminum oxide, gallium indium oxide, titanium indium oxide, zirconium indium oxide, tungsten indium oxide, molybdenum indium oxide, zirconium tin oxide, zirconium zinc oxide, alloys thereof, derivatives thereof, doped variants thereof, and combinations thereof.

18. The method of claim 10, wherein the oxide of at least two elements is a ternary oxide selected from the group consisting of zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, and combinations thereof.

19. The method of claim 11, wherein the oxide of at least two elements is a ternary oxide selected from the group consisting of zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, and combinations thereof.

20. The method of claim 12, wherein the oxide of at least two elements is a ternary oxide selected from the group consisting of zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, and combinations thereof.

21. The method of claim 13, wherein the oxide of at least two elements is a ternary oxide selected from the group consisting of zinc indium tin oxide, gallium indium tin oxide, indium gallium zinc oxide, cadmium tin indium oxide, zinc tin gallium oxide, indium tin antimony oxide, zirconium titanium indium oxide, zirconium tungsten indium oxide, zirconium molybdenum indium oxide, zirconium aluminum zinc oxide, zirconium tin indium oxide, titanium tungsten indium oxide, titanium molybdenum indium oxide, tungsten molybdenum indium oxide, alloys thereof, derivatives thereof, doped variants thereof, and combinations thereof.

22. The method of claim 7, wherein the providing step comprises deposition of the transparent conductive oxide material via a process selected from the group consisting of sputtering, evaporation, pulsed laser deposition, CVD, PE-CVD, PE-ALD, sol gel coating, dip coating, spin coating, flow coating, ultrasonic spray deposition, aerosol deposition, meniscus coating, inkjet coating, electrochemical deposition, electroless deposition, nanoparticle deposition, spray pyrolysis and plasma coating.

\* \* \* \* \*